(12) United States Patent
Lakirovich et al.

(10) Patent No.: US 10,277,217 B2
(45) Date of Patent: Apr. 30, 2019

(54) CONTROLLED BOOTSTRAP DRIVER FOR HIGH SIDE ELECTRONIC SWITCHING DEVICE

(71) Applicant: Woodward, Inc., Fort Collins, CO (US)

(72) Inventors: Konstantin Lakirovich, Chicago, IL (US); Steven Adams, Park Ridge, IL (US)

(73) Assignee: Woodward, Inc., Fort Collins, CO (US)

( * ) Notice: Subject to any disclaimer, the term of this patent is extended or adjusted under 35 U.S.C. 154(b) by 301 days.

(21) Appl. No.: 14/968,458

(22) Filed: Dec. 14, 2015

(65) Prior Publication Data

US 2017/0170748 A1   Jun. 15, 2017

(51) Int. Cl.
*H02M 7/5395* (2006.01)
*H03K 17/08* (2006.01)
*H02M 7/538* (2007.01)

(52) U.S. Cl.
CPC ............ *H03K 17/08* (2013.01); *H02M 7/538* (2013.01)

(58) Field of Classification Search
CPC .... H02M 3/3155; H02M 3/323; H02M 3/335; H02M 7/537; H02M 3/155; H02M 3/325
USPC ........................................................ 363/131
See application file for complete search history.

(56) References Cited

U.S. PATENT DOCUMENTS

| | | | |
|---|---|---|---|
| 5,659,452 A | 8/1997 | Blackburn | |
| 6,714,067 B1 | 3/2004 | Farrenkopf | |
| 6,844,779 B2 | 1/2005 | McEwen | |
| 6,917,240 B2 | 7/2005 | Trafton et al. | |
| 7,026,801 B2 | 4/2006 | Fowler et al. | |
| 7,432,756 B2 | 10/2008 | Boe | |
| 7,589,571 B1 | 9/2009 | Wittenbreder, Jr. | |
| 7,592,831 B2 | 9/2009 | Locatelli et al. | |
| 7,609,036 B2 | 10/2009 | Bartolo et al. | |
| 7,710,167 B2 | 5/2010 | Bernacchia | |

(Continued)

FOREIGN PATENT DOCUMENTS

WO    WO 95/34946 A1    12/1995

OTHER PUBLICATIONS

"HV Floating MOS-Gate Driver ICs," Application Note AN-978, International Rectifier, Mar. 2007, 30 pages.

(Continued)

*Primary Examiner* — Harry R Behm
*Assistant Examiner* — Lorena D Bruner
(74) *Attorney, Agent, or Firm* — Fish & Richardson P.C.

(57) ABSTRACT

The subject matter of this specification can be embodied in, among other things, a method that includes providing first power received from a first power bus to a first switching device configured to switch first power to a first output port based on a first input signal received at a first input port, providing second power received from a second power bus to a second switching device configured to switch second power to a first bootstrap capacitor coupled between the second switching device and the first output port based on a second input signal received at a second input port, providing an output voltage to the first output port, providing the second input signal to the second input port, switching the second switching device based on the second input signal, and charging the first bootstrap capacitor with second power received from the second power bus.

22 Claims, 10 Drawing Sheets

(56) References Cited

U.S. PATENT DOCUMENTS

| | | | |
|---|---|---|---|
| 7,733,135 B2 | 6/2010 | Dagli et al. | |
| 7,986,172 B2 | 7/2011 | Sicard | |
| 8,154,334 B2 | 4/2012 | Wang | |
| 8,581,638 B2 | 11/2013 | Chen et al. | |
| 8,610,413 B2 | 12/2013 | Bahramian et al. | |
| 8,749,277 B2 | 6/2014 | Kenney | |
| 8,779,733 B2 | 7/2014 | Chen | |
| 8,779,809 B2 | 7/2014 | Murakami et al. | |
| 8,860,344 B2 | 10/2014 | Andersen | |
| 8,994,411 B2 | 3/2015 | Draxelmayr et al. | |
| 9,024,681 B2 | 5/2015 | Murakami et al. | |
| 2013/0293214 A1 | 11/2013 | Chang et al. | |
| 2014/0062449 A1 | 3/2014 | Qu et al. | |
| 2015/0061611 A1 | 3/2015 | Li | |
| 2015/0077081 A1* | 3/2015 | Ejury | H02M 7/538 323/282 |
| 2015/0188425 A1 | 7/2015 | Chang et al. | |
| 2015/0263629 A1* | 9/2015 | Stuler | H02M 3/33546 363/21.02 |
| 2015/0311797 A1* | 10/2015 | Okamatsu | H02M 3/1582 323/271 |
| 2016/0065072 A1* | 3/2016 | Xiu | H02M 1/08 323/271 |

OTHER PUBLICATIONS

"Brushless DC Motor Controller," Texas Instruments, UC2625-EP, Mar. 2008, 26 pages.

Farchild, "Design and Application Guide of Bootstrap Circuit for High-Voltage Gate-Drive IC," App Note AN-6076, Copyright 2008, 15 pages.

Intersil, "80V, 500mA, 3-Phase MOSFET Driver", Datasheet, p/n HIP4086A, Feb. 1, 2013, 16 pages.

Merello et al. "Using Monolithic High Voltage Gate Drives," International Rectifier, published on or before 2012, 11 pages.

International Rectifier, "IRS 2110 (-1, -2, S) PbF, IRS2113 (-1, -2, S) PbF, High and Low Side Driver", Datasheet, PD60249, Jan. 22, 2007, 19 pages.

* cited by examiner

CONTROLLED BOOTSTRAP DRIVER FOR HIGH SIDE ELECTRONIC SWITCHING DEVICE

TECHNICAL FIELD

This instant specification relates to inverter circuits having bootstrap capacitors.

BACKGROUND

In some designs of power inverter circuits, two power MOSFET switches are arranged in a totem pole (half-bridge) topology. The power MOSFET switches are driven to conduct alternately, in which one of the MOSFET switches is designated as a high side switch, and the other MOSFET switch is designated as the low side switch. By selectively switching the power MOSFET switches in an alternating fashion, a load can be driven with an alternating current, forming a DC to AC inverter.

The gate of the high side switch is typically driven by a bootstrapped power supply, and a bootstrap capacitor is used to increase the voltage available to the gate of the high side switch. A MOSFET is a voltage-controlled device which will allows very little gate current to pass, thereby making it possible to utilize the charge inside the capacitor for control purposes. However, due to parasitic gate current and non-ideal (i.e. finite) internal resistance the capacitor will eventually lose its charge. At very low (or steady-state) switching speeds, the bootstrap capacitor may discharge without having an opportunity to recharge. Most control schemes that use a bootstrap capacitor force the high side driver off for a minimum time to allow the capacitor to recharge.

Such bootstrapped architectures are generally operated at less than 100% duty cycle rather than a steady-state basis, sacrificing a margin of performance in order to allow for the capacitor to recharge. However, such circuits may still encounter situations in which external conditions may cause a 100% or near-100% operating condition, such as when a motor being driven by the inverter circuit becomes stalled.

SUMMARY

In general, this document describes inverter circuits having bootstrap capacitors.

In a first aspect, a circuit includes a phase circuit including an output port and a high side circuit. The high side circuit includes a first input port, a first switching device configured to receive first power from a first power bus and switch first power to the output port based on an input signal received at the first input port, a second switching device, and a bootstrap capacitor coupled between the second switching device and the output port, wherein the second switching device is configured to receive power from a second power bus and switch second power to the bootstrap capacitor based on an input signal received at the second input port.

Various embodiments can include some, all, or none of the following features. The second switching device can be an optoisolator. The phase circuit can also include a low side circuit including a third input port, a third switching device configured to switch power from the output port to ground based on a third input signal received at the third input port. The first input signal may not active when the third input signal is active, and the third input signal may not active when the first input signal is active. The second input signal can be based on the third input signal. The second input signal can be based on the first input signal. The second input signal can be based on a voltage on the output port. The second input signal can be based on a voltage on the bootstrap capacitor. The circuit can be a switching power supply including the phase circuit and at least another phase circuit configured to switch first power to another output port based on another input signal received at another input port, and receive power from the second power bus and switch second power to another bootstrap capacitor.

In a second aspect, a method of operating a switching power supply includes providing first power received from a first power bus to a first switching device configured to switch first power to a first output port based on a first input signal received at a first input port, providing second power received from a second power bus to a second switching device configured to switch second power to a first bootstrap capacitor coupled between the second switching device and the first output port based on a second input signal received at a second input port, providing, by the first switching device and in response to the first input signal, an output voltage to the first output port, providing the second input signal to the second input port, switching the second switching device based on the second input signal, and charging the first bootstrap capacitor with second power received from the second power bus.

Various implementations can include some, all, or none of the following features. The second switching device can be an optoisolator. First power received from the first output port can be provided to a third switching device configured to switch power at the first output port to ground based on a third signal received at a third input port. The first input signal may not active when the third input signal is active, and the third input signal may not be active when the first input signal is active. The second input signal can be based on the third input signal. The second input signal can be based on the first input signal. The second input signal can be based on a voltage on the first output port. The second input signal can be based on a voltage on the first bootstrap capacitor. The method can also include providing first power received from the first power bus to a third switching device configured to switch first power to a second output port based on a third input signal received at a third input port, providing second power received from the second power bus to a fourth switching device configured to switch second power to a second bootstrap capacitor coupled between the fourth switching device and the second output port based on a fourth input signal received at a fourth input port, providing, by the third switching device and in response to the third input signal, a second output voltage to the second output port, providing the fourth input signal to the fourth input port, switching the fourth switching device based on the second output voltage, and charging the second bootstrap capacitor from the second power supply. The method can also include providing the first output voltage to an electric actuator, stalling the electric actuator to create a stall condition, and charging the first bootstrap capacitor from the second power bus during the stall condition. The first input signal can be a direct current (DC) signal. The first input signal can be a pulse width modulated (PWM) signal. The first input signal can be a 100% duty cycle PWM signal.

The systems and techniques described here may provide one or more of the following advantages. First, a system can provide full utilization of bus voltage (e.g., 100% duty cycle operation). Second, the system can operate without skipping pulse width modulation pulses for some control configurations, such as trap drive. Third, the system can be implemented with fewer parts and less space than previous designs. Fourth, the system can provide higher reliability through use of a single high side power supply. Fifth, unlike systems that use three floating power supplies on the phase line, the system does not require an additional rectification scheme. Sixth, the system can use high side power supplies having simplified construction.

The details of one or more implementations are set forth in the accompanying drawings and the description below. Other features and advantages will be apparent from the description and drawings, and from the claims.

DETAILED DESCRIPTION

This document describes systems and techniques for recharging bootstrap capacitors in inverter circuits, such as motor control circuits. In general, the circuits described in this document use controllable switching devices to recharge bootstrap capacitors in an arrangement that extends the operability of the circuit to 100% duty cycle, resists negative effects of steady-state conditions (e.g., motor stall), and powers multiple phases from a shared power supply.

Generally speaking, inverter circuits receive input power and one or more pulsed or pulse width modulated (PWM) phase control inputs, and provide one or more phases of inverted (e.g., AC) output power to an electrical load. At lower switching speeds, the bootstrap capacitor of some prior inverter circuits has a tendency to discharge, which in a stall or low speed conditions may lead to loss of power (e.g., when a MOSFET motor bridge is unable to provide sufficient current to a load's motor winding). Some prior designs provide a small additional current to the bootstrap capacitor from a charge pump during stall conditions. Such circuits generally do not have a second power source and the charging current can be very small, which may lead to capacitor discharge, and in the case of motor loads, a loss of torque.

Some prior inverter circuits address the recharging problem by utilizing p-channel MOSFETs on the top of the bridge circuit. This method, however, results in higher power losses due to p-channel MOSFETs' slow transition to the "off" state and higher conductive losses due to higher $Rds_{on}$. These losses may be higher (e.g., 2×-3× higher) compared with bootstrapped n-channel MOSFET designs. Some prior inverter circuits address the recharging problem by using three independent floating power supplies. This solution, however, generally requires a complex multi-winding isolated power supply, or three independent isolated power supplies, to feed the driver circuitry. As mentioned previously, the circuits described below use controllable switching devices to recharge bootstrap capacitors in an arrangement that extends the operability of the circuit to 100% duty cycle, resists negative effects of steady-state conditions (e.g., motor stall), and powers multiple phases from a shared power supply.

Figure 1:
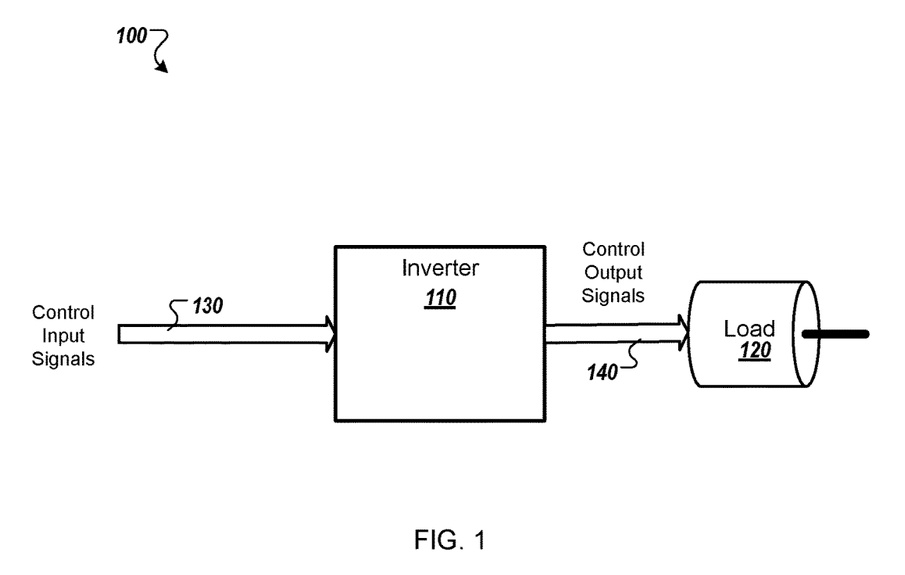
FIG. 1 is a block diagram of an example power delivery system.

FIG. 1 is a block diagram of an example power delivery system 100. The power delivery system 100 includes a power inverter 110 and an electrical load 120 (e.g., a brushless DC motor, a brushed DC motor, a switching power supply, a switching power converter, a stepper motor, an AC induction motor, a solenoid, a relay). The power inverter 110 receives a collection of control input signals 130, such as one or more pulse width modulated (PWM) signals from a control system (not shown). The power inverter 110, in response to the control input signals, provides one or more control output signals 140 to the load 120. For example, the power inverter 110 can receive one or more low power trigger signals as the control input signals 130, and in response provide one or more high power outputs as the control output signals 140. In some implementations, the control output signals 140 can provide controlled high power signals to drive one or more phases of an alternating current (AC) motor or any other appropriate electrical load.

Figure 2:
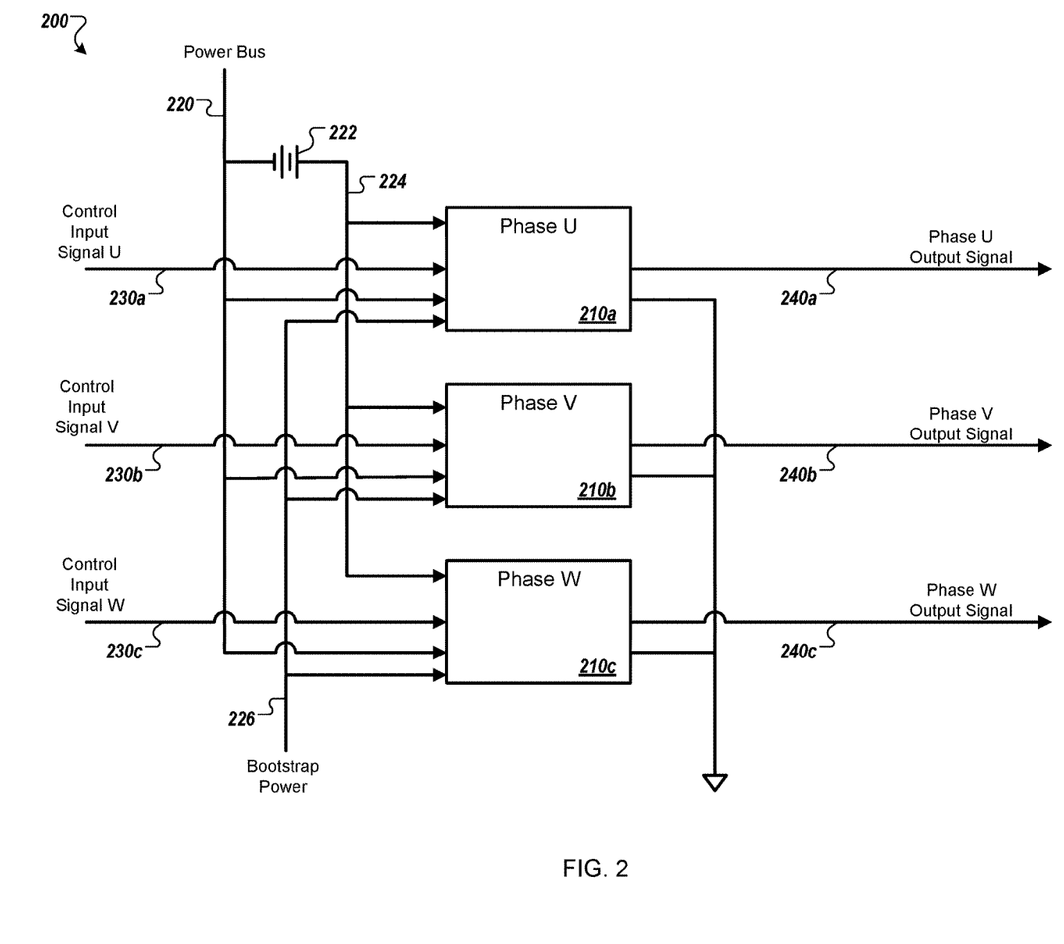
FIG. 2 is a block diagram of an example power inverter.

FIG. 2 is a block diagram of an example power inverter 200. In some embodiments, the power inverter 200 can be the example power inverter 110 of FIG. 1. The power inverter 200 includes a collection of phase power circuits 210a-210c. Each of the phase power circuits 210a-210c receives power from a power bus 220 that is shared among all of the phase power circuits 210a-210c. A voltage source 222 boosts the voltage of a power bus 224 by a predetermined voltage above the voltage of the power bus 220. Each of the phase power circuits 210a-210c also receives bootstrap power from a bootstrap power bus 226 that is shared among all of the phase power circuits 210a-210c.

Each of the example phase power circuits 210a-210c receives control input signals from a corresponding collection of control input signal lines 230a-230c. In some embodiments, each of the control input signals can be one or more of the control input signals 130. Each of the example phase power circuits 210a-210c provides, in response to signals received on corresponding ones of the control input signals 230a-230c, a corresponding phase output signal on corresponding ones of a collection of phase output signal lines 240a-240c. In some embodiments, each of the phase output signals can be one or more of the control output signals 140. For example, the phase power circuit 210a can receive one or more low power PWM signals on the control input signal lines 230a, and in response the phase power circuit 210a provide a high power signal at the phase output signal line 240a (e.g., to drive one corresponding phase of an AC motor).

In the example of power inverter 200 three phase power circuits 210a-210c are shown and described. In some examples, such a configuration can be used to drive a load such as a three-phase AC motor. In other embodiments of the power inverter 200, any appropriate number of the phase power circuits 210a-210c can be used to drive any appropriate embodiment of the load 120 having a corresponding number of electrical phases.

Figure 3:
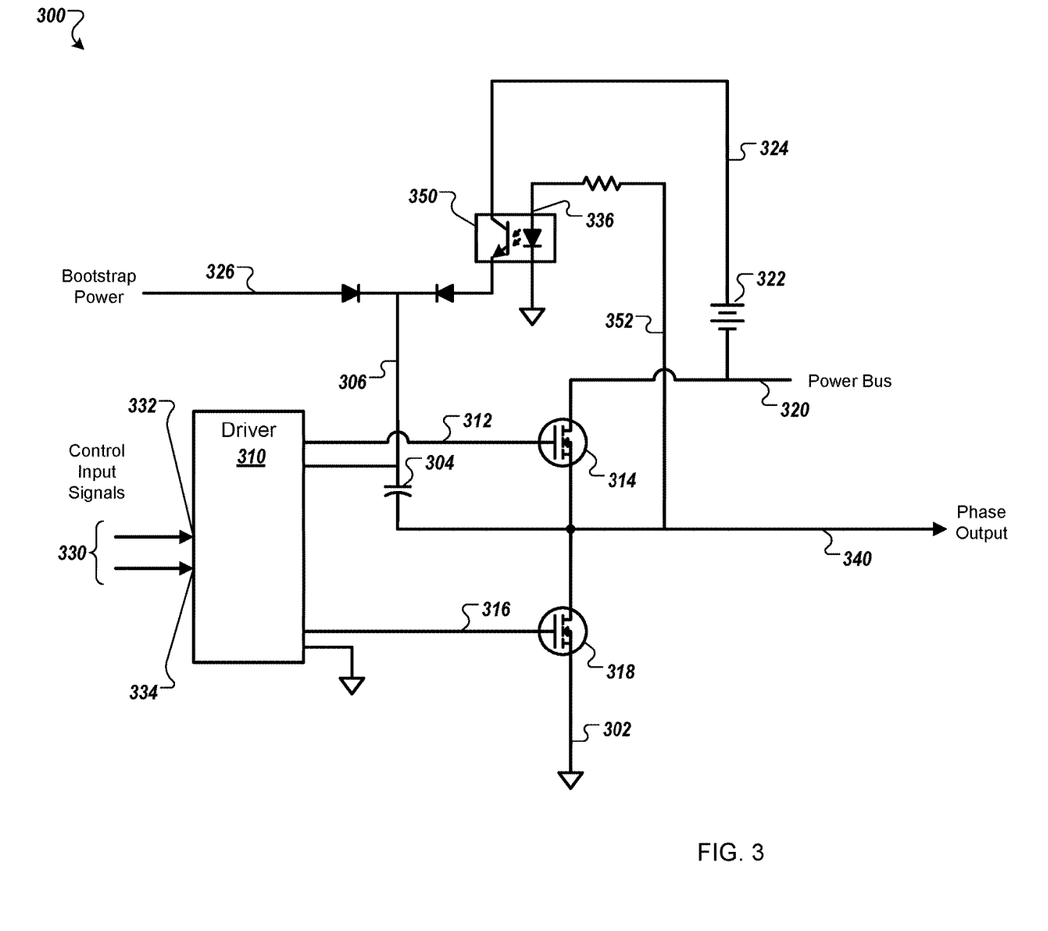
FIG. 3 is a schematic diagram of an example phase circuit of a power inverter.

FIG. 3 is a schematic diagram of an example phase power circuit 300 of a power inverter. In some embodiments, the example phase power circuit 300 can be one of the example phase power circuits 210a-210c of the example power inverter 200 of FIG. 2.

The phase power circuit 300 includes a driver circuit 310. The driver circuit 310 is configured to receive one or more control input signals on a collection of control input signal lines 330 received at an input port 332 and at an input port 334. In some embodiments, the control input signals can be low-power signals provided by a controller (not shown). In some embodiments the control input signals can be some or all of the control input signals 130 of the example power delivery system 100 of FIG. 1. In some embodiments, the control input signal lines 330 can be some or all of the control input signal lines 230a-230c of the example power inverter 200 of FIG. 2.

The driver circuit 310 is configured to provide a high side switching signal on a high side signal line 312. The high side signal line 312 is in electrical communication with a high side switching device 314. The high side switching device 314 is configured to receive power from a power bus 320 (e.g., the example power bus 220 of FIG. 2) and controllably provide that power as a high side phase output signal to a phase output signal line 340 based on the state of the high side switching signal on the high side signal line 312. For example, the high side switching device 314 can be a MOSFET with its drain connected to the power bus 320, its source connected to the phase output signal line 340, and its gate connected to the high side switching signal line 312. When the high side switching signal is active, the high side switching device 314 passes the power from the power bus 320 to the phase output signal line 340 as the high side phase output signal.

The driver circuit 310 is configured to provide a low side switching signal on a low side signal line 316. The low side signal line 316 is in electrical communication with a low side switching device 318. The low side switching device 318 is configured to receive power from the phase output signal line 340 and controllably sink that power to ground 302 to form a low side phase output signal based on the state of the low side switching signal on the low side signal line 316. For example, the low side switching device 318 can be a MOSFET with its drain connected to the phase output signal line 340, its source connected to ground 302, and its gate connected to the low side switching signal line 316. When the low side switching signal is active, the low side switching device 318 passes the power from the phase output signal line 340 to ground 302, which presents the low side phase output signal.

The phase power circuit 300 also includes a bootstrap capacitor 304. The bootstrap capacitor 304 electrically connects the phase output signal line 340 to a bootstrap recharging line 306. The bootstrap recharging line 306 is energized by a combination of bootstrap power provided by a bootstrap power bus 326 (e.g., the example bootstrap power bus 226 of FIG. 2) and boosted power provided by a boosted power bus 324 (e.g., the example power bus 224 of FIG. 2). The boosted power is provided by the power bus 320 and a voltage source 322 (e.g., the example voltage source 222 of FIG. 2) configured to boost the voltage of the boosted power bus 324 above the voltage of the power bus 320. In some embodiments, the voltage of the boosted power bus 324 can vary with the voltage of the power bus 320, with a boost provided by the voltage source 322 above and relative to the voltage of the power bus 320.

The boosted power is controllably provided to the bootstrap recharging line 306 through a switching device 350. The switching device 350 receives the boosted power from the boosted power bus 324, and controllably provides the boosted power to the recharging line 306 based on a bootstrap feedback signal provided to an input port 336 by a bootstrap feedback signal line 352. When a potential on the bootstrap feedback signal line 352 is high enough to activate the switching device 350, boosted power from the boosted power bus 324 is allowed to flow to the bootstrap recharging line 306. The potential on the bootstrap feedback signal line 352 is based on the state of the high side switching device 314 and low side switching device 318. In operation, when the high side switching device 314 is configured to accept a conductive state and the low switching device 318 is configured to accept a high impedance state, the potential on bootstrap feedback signal line 352 rises above ground 302. When switches for high and low side change their state respectively for the high side switching device 312 as a high impedance state and for the low side switching device 318 as a conductive state, the potential on the bootstrap feedback signal line 352 falls to ground 302. In the illustrated example, the switching device 350 is depicted as an optoisolator, but in some embodiments the switching device 350 can be a transistor, a solid state relay, an electromechanical relay, a vacuum tube, or any other appropriate form of controllable switching device.

The input port 332, the high side switching device 314, the switching device 350, and the bootstrap capacitor 304 are part of a high side circuit configured to receive power from the power bus 320 based on an input signal (e.g., one of the control input signals 330) received at input port 332. The input port 334 and the low side switching device 318 are part of a low side circuit configured to divert power from the power bus 320 based on an input signal (e.g., one of the control input signals 330) received at input port 334. In some embodiments, one or more of the control input signals 330 can be direct current (DC) signals. In some implementations, the control input signal 330 at the input port 332 may not be active when the control input signal 330 at the input port 334 is active, and the control input signal 330 at the input port 334 may not be active when the control input signal 330 at the input port 332 is active. In some embodiments, one or more of the control input signals 330 can be pulse width modulated (PWM) signals. In some embodiments, one or more of the control input signals 330 can be 100% duty cycle PWM signals.

Power flows along the bootstrap recharging line 306 to charge the bootstrap capacitor 304. Charge stored by the bootstrap capacitor 304 can be used later to provide periodic bursts of additional power to maintain the conductive state of the high side switching device 314. In the example of the phase power circuit 300, the power present on the phase output signal line 340 is provided back to the switching device through the bootstrap feedback line 352. The operation of this configuration is discussed further in connection with the descriptions of FIGS. 4A and 4B.

Figure 4A:
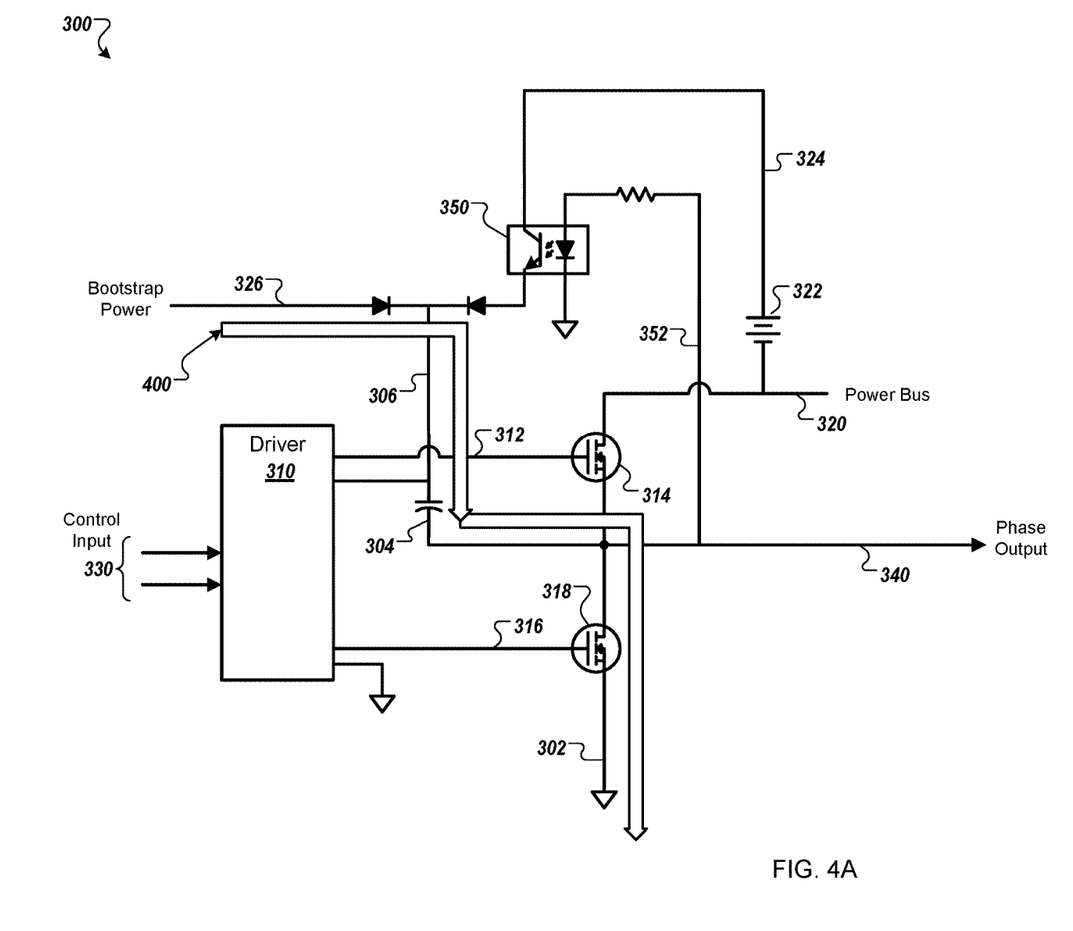
FIGS. 4A and 4B are schematics diagrams of example power flows through an example phase circuit.
Figure 4B:
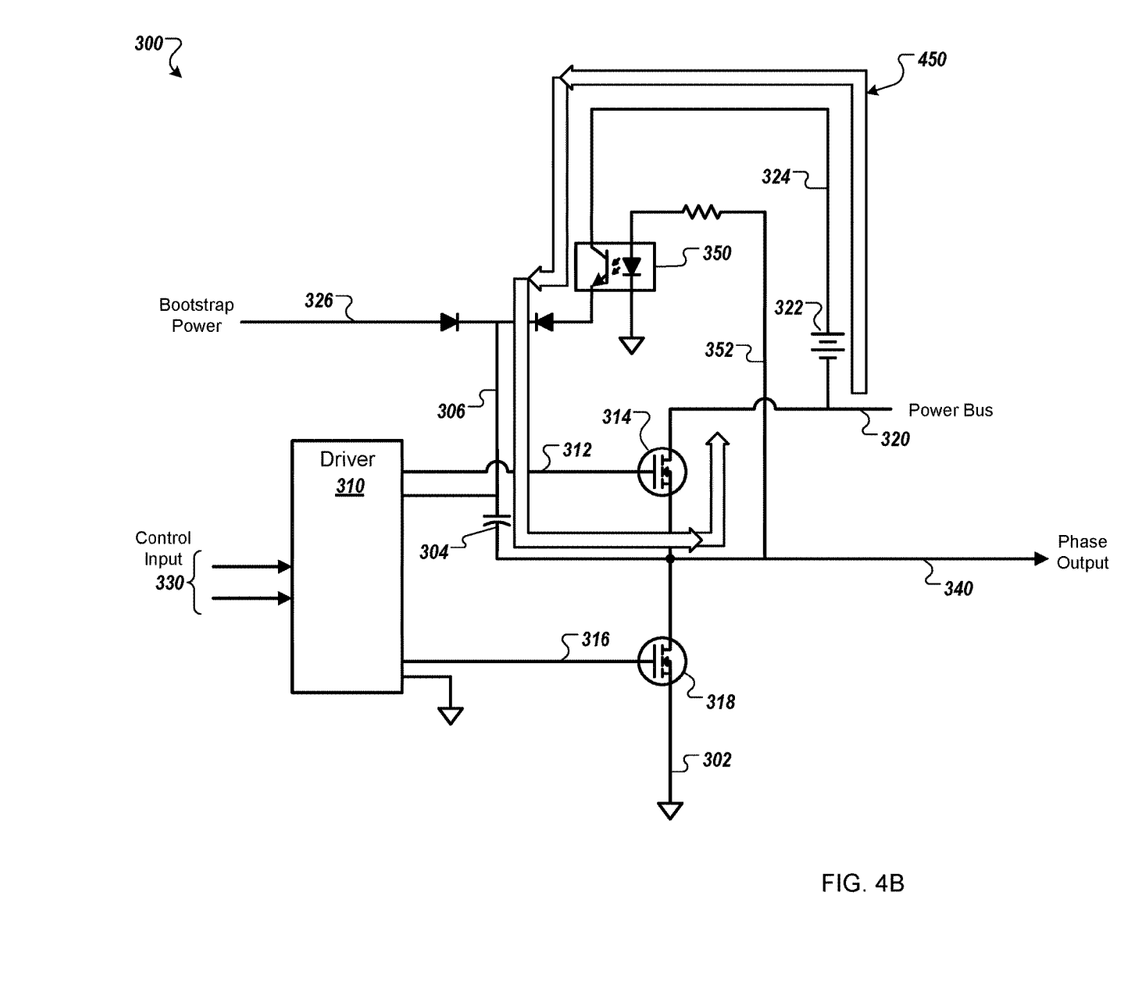

FIGS. 4A and 4B are schematics diagrams of example power flows 400 and 450 through the example phase power circuit 300 of FIG. 3. FIG. 4A illustrates the phase power circuit 300 providing a low side phase signal. In the illustrated example, the driver circuit 310 is providing the low side switching signal on the low side signal line 316. In response to the presence of the low side switching signal on the low side signal line 316, the low side switching device 318 passes the power from the phase output signal line 340 to ground 302, which presents the low side phase output signal on the phase output signal line 340. Since the bootstrap capacitor 304 is also connected to the phase output signal line 340, the bootstrap capacitor 304 is also grounded.

In this configuration, the phase output signal on the phase output signal line 340 and the bootstrap feedback signal on the bootstrap feedback signal line 352 are both at ground. As such, switching device 350 is inactive, blocking current flow from the boosted power bus 324 to the bootstrap capacitor 304. The power flow 400 flows from the bootstrap power bus 326, through the bootstrap capacitor 304, through the low side switching device 318, and out to ground 302.

FIG. 4B illustrates the phase power circuit 300 providing a high side phase signal. In the illustrated example, the driver circuit 310 is providing the high side switching signal on the high side signal line 312. Potential on the phase output signal line 340 and the bootstrap feedback signal line 352 goes higher than power ground and activates the switching device 350, allowing boosted power to flow as the power flow 450. The power flow 450 flows from the boosted power bus 326, through the switching device 350, to the bootstrap capacitor 304, and through the high side switching device 314 (e.g., through an intrinsic diode of a MOSFET acting as the high side switching device 314) back to the power bus 320. The power flow 450 charges the bootstrap capacitor 304 to the level of the boosted power bus 324 (e.g., a floating power supply). In this configuration, when the phase power circuit 300 experiences a low speed or stall condition, or when PWM cycle for the low side switching device 318 is not enough to maintain voltage on bootstrap capacitor 304 on its own, the phase power circuit 300 enables recharging of the bootstrap capacitor 304 to a predetermined level. In some implementations, by recharging the bootstrap capacitor 304 from the boosted power bus 324, loss of control of the bridge formed by the high side switching device 314 and the low side switching device 318 may be prevented.

Figure 5:
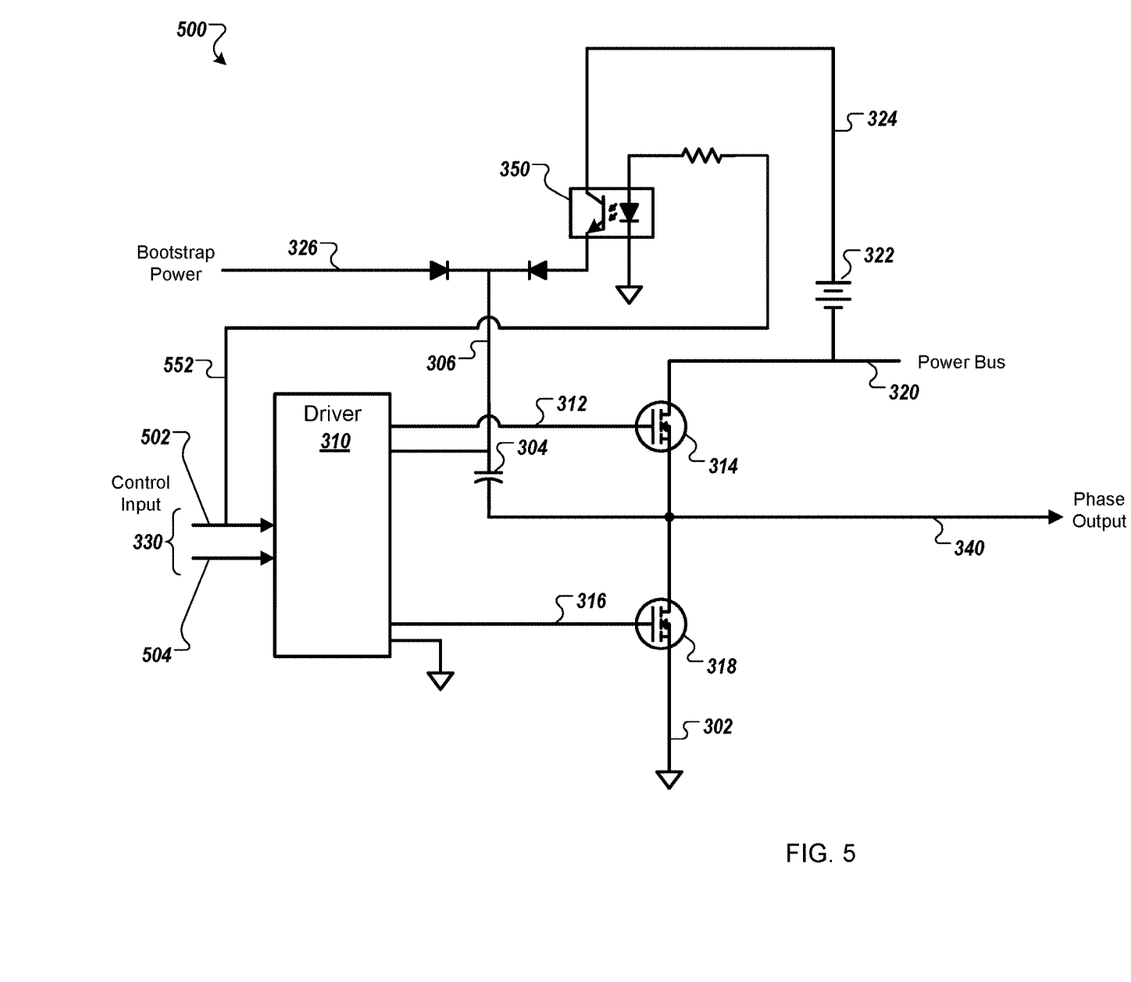
FIGS. 5-8 are schematic diagrams of other example phase circuits of a power inverter.

FIG. 5 is a schematic diagram of another example phase power circuit 500 of a power inverter. In some embodiments, the example phase power circuit 500 can be one of the example phase power circuits 210a-210c of the example power inverter 200 of FIG. 2. In general, the phase power circuit 500 is a modification of the example phase power circuit 300 of FIGS. 3, 4A, and 4B, which differs from phase power circuit 300 in the way that the switching device 350 is controlled. In general, in the phase power circuit 500, the recharging of the bootstrap capacitor 304 is based on the state of a high side input control signal line 502.

In the illustrated example, the driver circuit 310 is configured to receive a high side control input signal on a high side control input signal line 502 of the collection of control input signal lines 330. The driver circuit 310 is also configured to receive a low side control input signal on a low side control input signal line 504 of the collection of control input signal lines 330.

The switching device 350 is controlled by a bootstrap control signal received on a bootstrap control signal line 552. The bootstrap control signal line 552 electrically connects a control input of the switching device 350 to the high side input control signal line 502. In the illustrated configuration, the bootstrap control signal is present whenever the high side control input signal is present. As such, when the high side control input signal line 502 is inactive (e.g., when the low side control input signal line 504 is active), switching device 350 is inactive, blocking current flow from the boosted power bus 324 to the bootstrap capacitor 304.

When the high side control input signal line 502 is active, boosted power from the boosted power bus 324 is allowed to flow to the bootstrap recharging line 306. Power flows along the bootstrap recharging line 306 to charge the bootstrap capacitor 304. Charge stored by the bootstrap capacitor 304 can be used later to maintain the conductive state of the high side switching device 314. Unlike the example phase power circuit 300 in which the potential on the bootstrap feedback signal line 352 is a combination of the potentials provided by the high side switching device 314 and the low side switching device 318, the potential on the bootstrap control signal line 552 is provided by the high side control input signal line 502.

Figure 6:
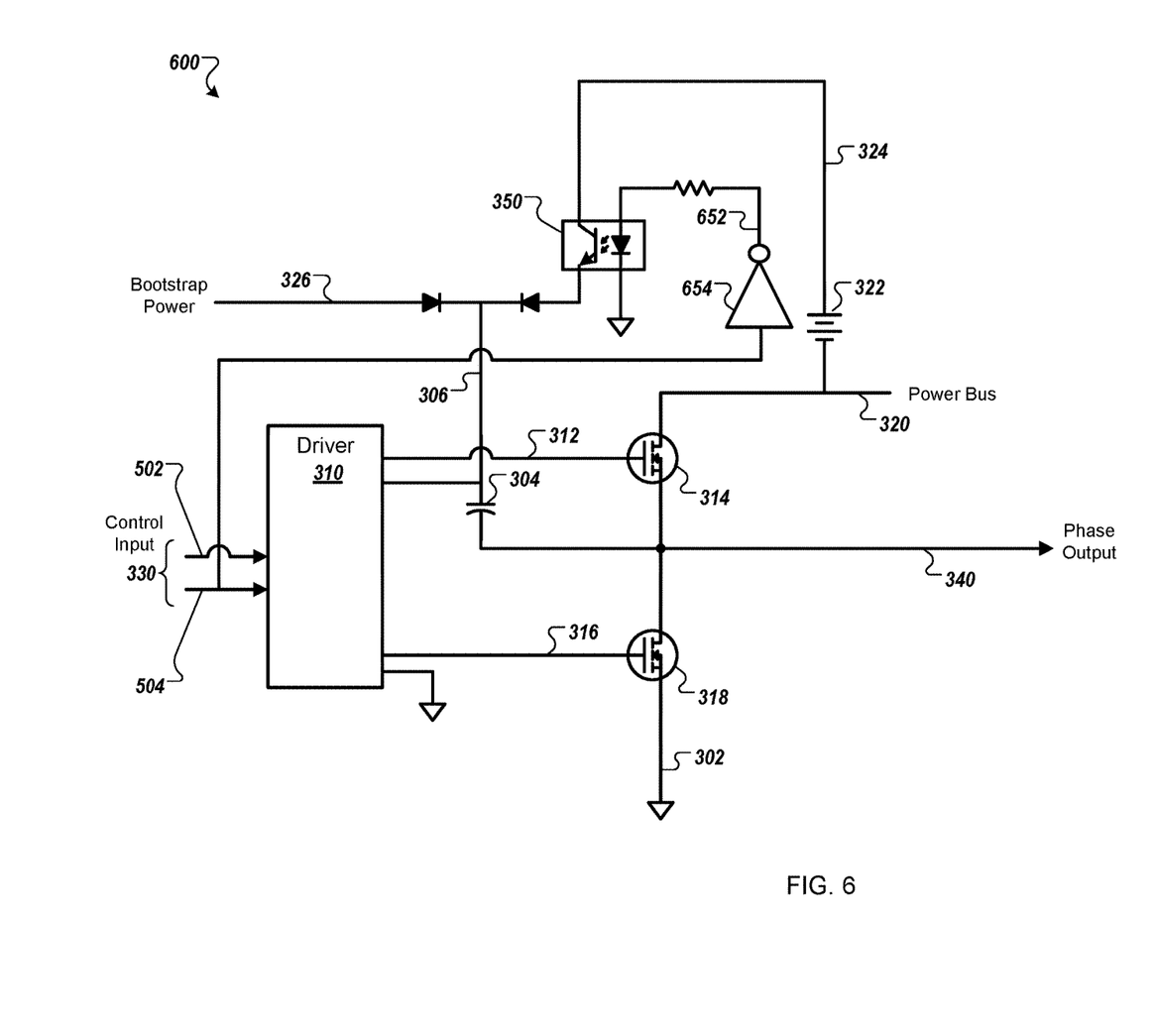

FIG. 6 is a schematic diagram of another example phase power circuit 600 of a power inverter. In some embodiments, the example phase power circuit 600 can be one of the example phase power circuits 210a-210c of the example power inverter 200 of FIG. 2. In general, the phase power circuit 600 is a modification of the example phase power circuit 300 of FIGS. 3, 4A, and 4B, which differs from phase power circuit 300 in the way that the switching device 350 is controlled. In general, in the phase power circuit 600, the recharging of the bootstrap capacitor 304 is based on the state of the low side input control signal line 504.

The switching device 350 is controlled by a bootstrap control signal received on a bootstrap control signal line 652. The bootstrap control signal line 652 and an inverter 654 electrically connects the control input of the switching device 350 to the low side input control signal line 504. In the illustrated configuration, the bootstrap control signal is present at the switching device 350 whenever the low side control input signal is absent. As such, when the low side control input signal line 504 is active (e.g., when the high side control input signal line 502 is inactive), switching device 350 is inactive, blocking current flow from the boosted power bus 324 to the bootstrap capacitor 304.

When the low side control input signal line 504 is inactive, boosted power from the boosted power bus 324 is allowed to flow to the bootstrap recharging line 306. Power flows along the bootstrap recharging line 306 to charge the bootstrap capacitor 304. Unlike the example phase power circuit 300 in which the potential on the bootstrap feedback signal line 352 is a combination of the potentials provided by the high side switching device 314 and the low side switching device 318, the potential on the bootstrap control signal line 652 is provided by the inverter 654, which inverts signals on the low side control input signal line 504.

Figure 7:
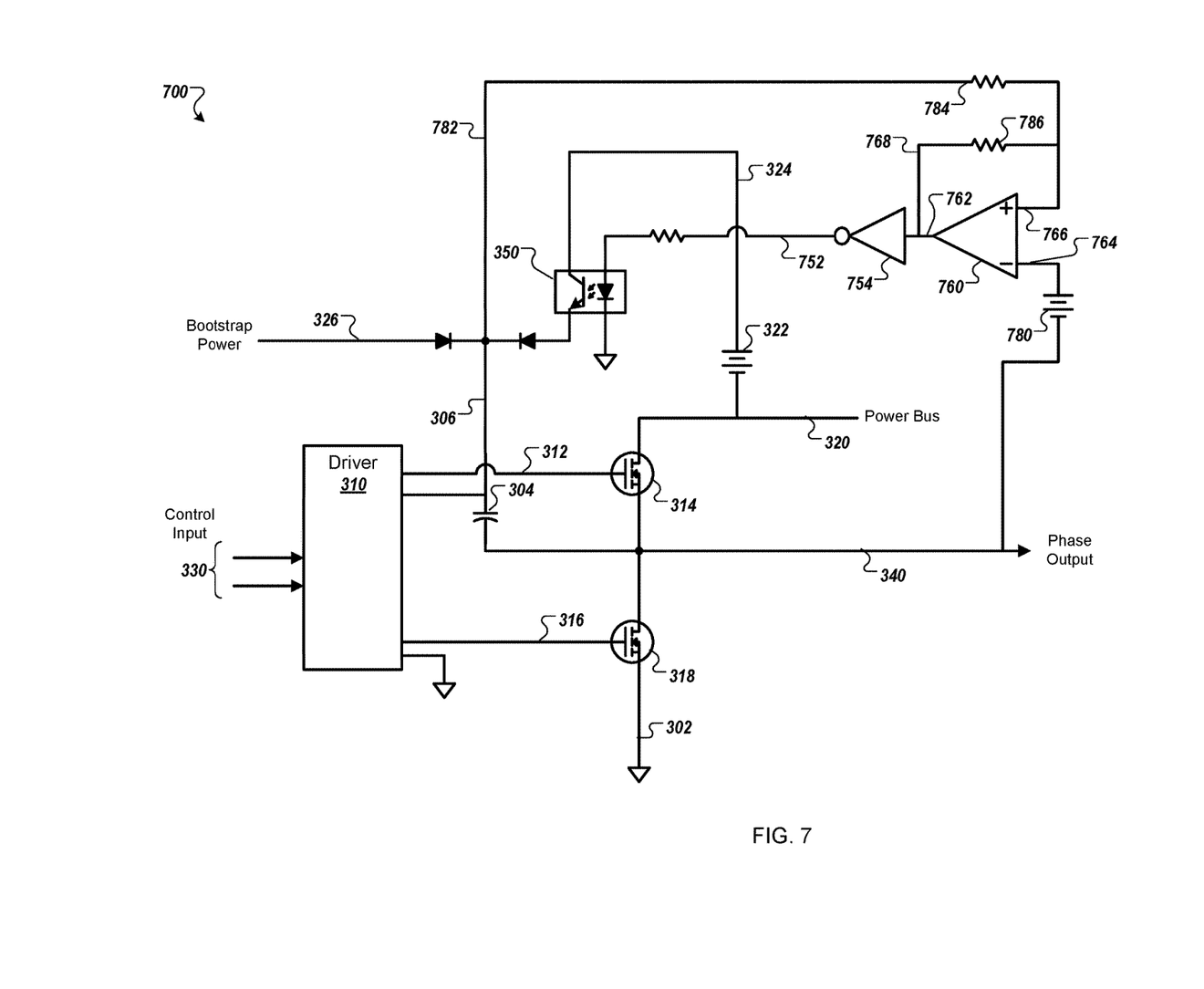

FIG. 7 is a schematic diagram of another example phase power circuit 700 of a power inverter. In some embodiments, the example phase power circuit 700 can be one of the example phase power circuits 210a-210c of the example power inverter 200 of FIG. 2. In general, the phase power circuit 700 is a modification of the example phase power circuit 300 of FIGS. 3, 4A, and 4B, which differs from phase power circuit 300 in the way that the switching device 350 is controlled. In general, in the phase power circuit 700, the recharging of the bootstrap capacitor 304 is based on the electrical potential present at the bootstrap capacitor 304.

The switching device 350 is controlled by a bootstrap control signal received on a bootstrap control signal line 752. The bootstrap control signal line 752 and an inverter 754 electrically connects the control input of the switching device 350 to an output 762 of an operational amplifier 760.

The operational amplifier 760 is configured as a comparator with hysteresis. A negative input 764 of the operational amplifier 760 receives a voltage potential present on the phase output signal line 340 and boosted by a voltage source 780 which is considered as a reference voltage for the operational amplifier 760. In the illustrated configuration, the potential at the negative input 764 can be represented as a reference voltage $V_{ref}$. A positive input 766 of the operational amplifier 760 receives positive feedback from a positive feedback line 768 combined with the potential of the bootstrap capacitor 304 as provided by a bootstrap potential feedback line 782. A resistor 784 and a resistor 786 form a voltage divider, with the total feedback voltage being proportional to the ratio of the resistors 784, 786 and dependent on voltage on the bootstrap capacitor 304 and voltage of the output 762 of the operation amplifier. In the illustrated configuration, the potential at the positive input 766 can be represented as an input voltage $V_{in}$, which value depends on the voltage on the bootstrap capacitor 304 with a small attenuation in the positive or negative side from the positive feedback line 768. In some embodiments, a positive feedback resistor (e.g., the resistor 786) having much higher impedance than the feedback resistor 784. In such an arrangement, the feedback voltage can substantially replicate the voltage of interest. When the potential at the negative input 764 is less than the voltage at the bootstrap capacitor, then $V_{ref}<V_{in}$, and the voltage at the output 762 will be high. The inverter 754 inverts the signal provided at the output 762 to become the bootstrap control signal on the bootstrap control signal line 752 to control activation of the switching device 350.

As such, when the bootstrap capacitor 304 is high (e.g., charged), the switching device 350 is inactive, blocking current flow from the boosted power bus 324 to the bootstrap capacitor 304.

When the bootstrap capacitor 304 is low (e.g., discharged), the potential at the negative input 764 is higher than the voltage at the bootstrap capacitor, then $V_{ref}>V_{in}$, and the voltage at the output 762 will be low. The inverter 754 inverts the signal provided at the output 762 to become the bootstrap control signal (high) on the bootstrap control signal line 752 to control activation of the switching device 350, boosted power from the boosted power bus 324 is allowed to flow to the bootstrap recharging line 306. Power flows along the bootstrap recharging line 306 to charge the bootstrap capacitor 304. Unlike the example phase power circuit 300 in which the potential on the bootstrap feedback signal line 352 is a combination of the potentials provided by the high side switching device 314 and the low side switching device 318, the bootstrap control signal line 552 is activated as a function of the state of charge on the bootstrap capacitor 304 itself.

Figure 8:
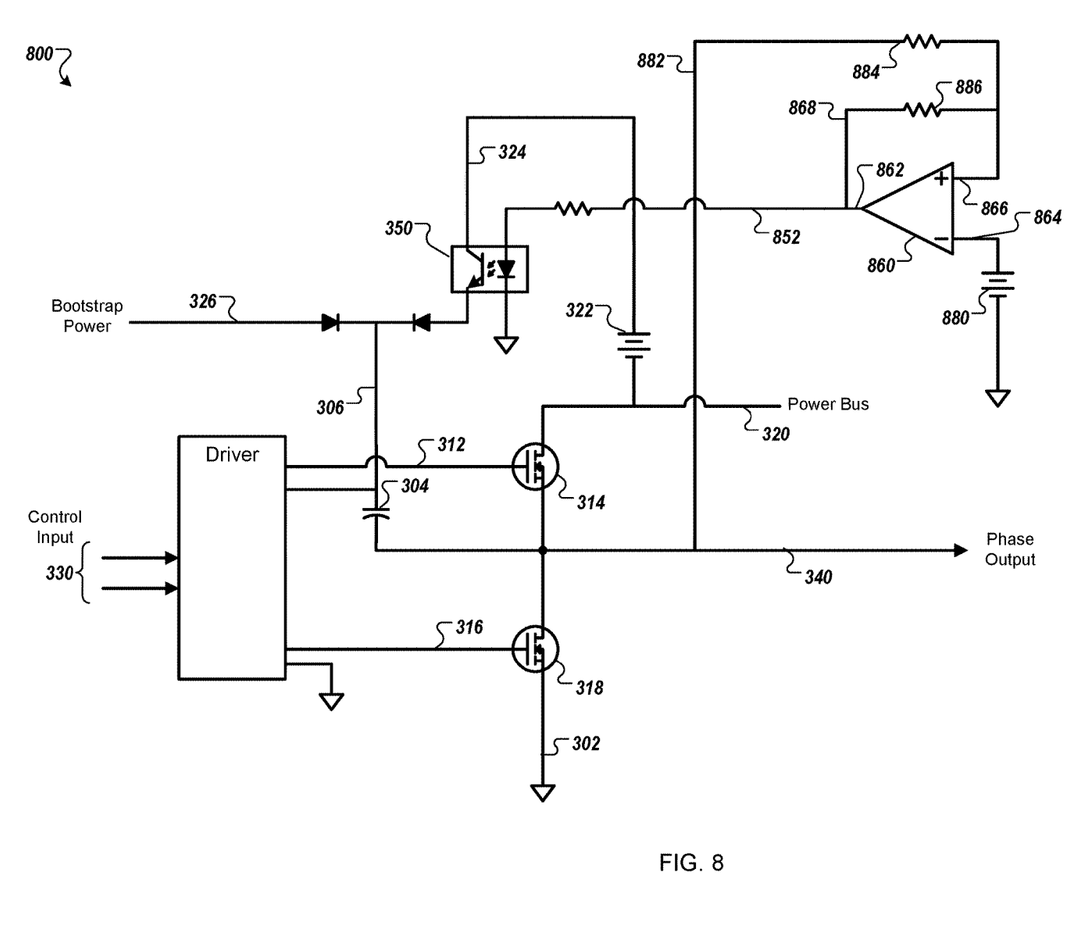

FIG. 8 is a schematic diagram of another example phase power circuit 800 of a power inverter. In some embodiments, the example phase power circuit 800 can be one of the example phase power circuits 210a-210c of the example power inverter 200 of FIG. 2. In general, the phase power circuit 800 is a modification of the example phase power circuit 300 of FIGS. 3, 4A, and 4B, which differs from phase power circuit 300 in the way that the switching device 350 is controlled. In general, in the phase power circuit 800, the recharging of the bootstrap capacitor 304 is based on the electrical potential present on the phase output signal line 340.

The switching device 350 is controlled by a bootstrap control signal received on a bootstrap control signal line 852. The bootstrap control signal line 852 electrically connects the control input of the switching device 350 to an output 862 of an operational amplifier 860.

The operational amplifier 860 is configured as a comparator with hysteresis. A negative input 864 of the operational amplifier 860 receives a voltage potential In relation to the ground 302 and is perceived as a reference voltage $V_{ref}$. A positive input 866 of the operational amplifier 860 receives positive feedback from a positive feedback line 868 combined with the potential of phase output signal line 340 as provided by a phase output signal feedback line 882. A resistor 884 and a resistor 886 form a voltage divider, with the total feedback being proportional to the ratio of the resistors 884, 886. In the illustrated configuration, the potential at the positive feedback line 868 can be represented as an input voltage $V_{in}$, which value depends on the voltage on the output line 340 with small attenuation in the positive or the negative side from the feedback line 868. In some embodiments, a positive feedback resistor (e.g., resistor 886) having much higher impedance than feedback resistor 884 can be used. In such an arrangement, the feedback voltage can substantially replicate the voltage of interest. When the potential at the negative input 864 is less than the voltage at phase output signal line 340, then $V_{in}>V_{ref}$, and the voltage at the output 862 will be high. The signal provided at the output 862 becomes the bootstrap control signal on the bootstrap control signal line 852 to control activation of the switching device 350.

As such, when the potential on the phase output signal line 340 is lower than or equal to a predetermined reference voltage 880 on the negative input of the operational amplifier 860, the switching device 350 is inactive, blocking current flow from the boosted power bus 324 to the bootstrap capacitor 304. When the potential on the phase output signal line 340 is higher than the predetermined reference voltage 880, voltage, boosted power from the boosted power bus 324 is allowed to flow to the bootstrap recharging line 306. Power flows along the bootstrap recharging line 306 to charge the bootstrap capacitor 304. Unlike the example phase power circuit 300 in which the potential on the bootstrap feedback signal line 352 is a combination of the potentials provided by the high side switching device 314 and the low side switching device 318, the bootstrap control signal line 552 activated as a the choice of the reference voltage 880 function of the state of the phase output signal line 304.

In some implementations, the switching device 350 can be controlled using high side control input signals (e.g., control input signals 330), low side control input signals (e.g., control input signals 330), the voltage on the bootstrap capacitor 304, the voltage on the output signal line 304, or any combination of these and/or any other appropriate feedback or input function.

Figure 9:
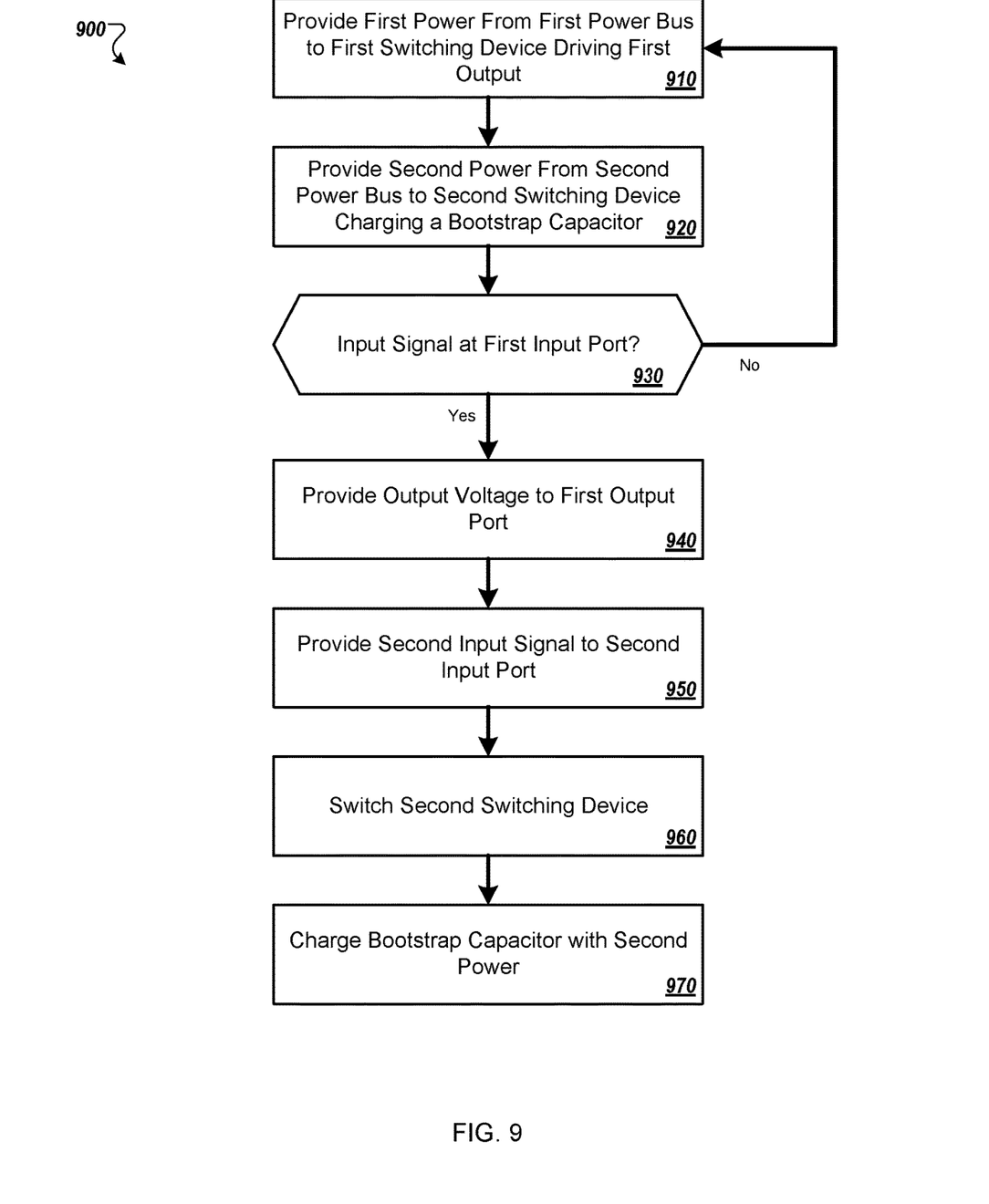
FIG. 9 is a flow diagram of an example process for operating a phase circuit.

FIG. 9 is a flow diagram of an example process 900 for operating a phase power circuit. The process 900 may be performed, for example, by a system such as the example power delivery system 100 of FIG. 1, the example power inverter 200 of FIG. 2, and/or the example phase power circuits 300, 400, 500, 600, 700, or 800 of FIGS. 3-8. For clarity of presentation, the description that follows uses the power delivery system 100, the power inverter 200, and the phase power circuit 300 as examples for describing the process 900. However, another system, or combination of systems, may be used to perform the process 900.

At 910, first power received from a first power bus is provided to a first switching device configured to switch first power to a first output port based on a first input signal received at a first input port. For example, the high side switching device 314 is configured to receive power from the power bus 320 and can controllably provide that power as the high side phase output signal to the phase output signal line 340 based on the state of the high side switching signal on the high side signal line 312.

In some implementations, the first input signal can be a direct current (DC) signal. In some implementations, the first input signal can be a pulse width modulated (PWM) signal. In some implementations, the first input signal can be a 100% duty cycle PWM signal. For example, the load 120 can be an electric motor, and the control input signals 120 can be PWM signals operated at or near 100% duty cycle (e.g., a PWM signal at 100% duty cycle can resemble a DC signal).

At 920, second power received from a second power bus is provided to a second switching device configured to switch second power to a first bootstrap capacitor coupled between the second switching device and the first output port based on a second input signal received at a second input port. For example, the switching device 350 receives the boosted power from the boosted power bus 324 and can controllably provide the boosted power to the bootstrap capacitor 304. In some embodiments, the second switching device can be an optoisolator, a solid state switch, a relay, or any other appropriate type of controllable switching device.

At 930, if there is no input signal at the first input port, then the process 900 continues at 910. If there is an input signal at the first input port, then at 940 the first switching device provides an output voltage to the first output port in response to the first input signal. For example, when the high side switching signal is active, the high side switching device 314 can pass the power from the power bus 320 to the phase output signal line 340 as the high side phase output signal.

At 950, the second input signal is provided to the second input port, and at 960 the second switching device is switched based on the second input signal. For example, the switching device 350 can receive the boosted power from the boosted power bus 324, and can controllably provide the boosted power to the recharging line 306 based on the bootstrap feedback signal provided to the input port 336 by the bootstrap feedback signal line 352.

At 970, the first bootstrap capacitor is charged with second power received from the second power bus. For example, when the potential on the bootstrap feedback signal line 352 is high enough to activate the switching device 350, boosted power from the boosted power bus 324 can flow to the bootstrap recharging line 306.

In some implementations, the process 900 can also include providing first power received from the first output port to a third switching device configured to switch power at the first output port to ground based on a third signal received at a third input port. For example, the low side switching device 318 can be configured to receive power from the phase output signal line 340 and controllably sink that power to ground 302 to form a low side phase output signal based on the state of the low side switching signal on the low side signal line 316. In some implementations, the first input signal may not be active when the third input signal is active, and the third input signal may not be active when the first input signal is active.

In some implementations, the second input signal can be based on the third input signal. For example, in the example phase power circuit 600, the recharging of the bootstrap capacitor 304 is based on the state of the low side input control signal line 504.

In some implementations, the second input signal can be based on the first input signal. For example, in the example phase power circuit 500, the recharging of the bootstrap capacitor 304 is based on the state of a high side input control signal line 502.

In some implementations, the second input signal can be based on a voltage on the first output port. For example, in the example phase power circuit 800, the recharging of the bootstrap capacitor 304 is based on the electrical potential present on the phase output signal line 340.

In some implementations, the second input signal can be based on a voltage on the first bootstrap capacitor. For example, in the example phase power circuit 700, the recharging of the bootstrap capacitor 304 is based on the electrical potential present at the bootstrap capacitor 304.

In some implementations, the process 900 can also include providing first power received from the first power bus to a third switching device configured to switch first power to a second output port based on a third input signal received at a third input port, providing second power received from the second power bus to a fourth switching device configured to switch second power to a second bootstrap capacitor coupled between the fourth switching device and the second output port based on a fourth input signal received at a fourth input port, providing, by the third switching device and in response to the third input signal, a second output voltage to the second output port, providing the fourth input signal to the fourth input port, switching the fourth switching device based on the second output voltage, and charging the second bootstrap capacitor from the second power supply. For example, the power inverter 200 includes the collection of phase power circuits 210a-210c. Each of the phase power circuits 210a-210c can receive power from the power bus 220 that is shared among all of the phase power circuits 210a-210c, and each of the phase power circuits 210a-210c can receive bootstrap power from the bootstrap power bus 226 that is shared among all of the phase power circuits 210a-210c.

In some implementations, the process 900 can also include providing the first output voltage to an electric actuator, and in case of stall condition of the electric actuator, providing charge to the first bootstrap capacitor from the second power bus during the stall condition. For example, the example power delivery system 100 includes a power inverter 110 (e.g., which can include the phase power circuit 300) and an electrical load 120 (e.g., a motor). When the phase power circuit 300 experiences a low speed or stall condition of the motor, or when PWM cycle for the low side switching device 318 is not enough to maintain voltage on bootstrap capacitor 304 on its own, the phase power circuit 300 can recharge the bootstrap capacitor 304 to a predetermined level utilizing the boosted power bus 324 and second switching device 350. In some examples, by recharging the bootstrap capacitor 304 from the boosted power bus 324, loss of control of the bridge formed by the high side switching device 314 and the low side switching device 318 may be prevented.

Although a few implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:
1. A circuit comprising:
   a phase circuit comprising:
      an output port; and
      a high side circuit comprising:
         a first input port;
         a first switching device configured to receive first power from a first power bus and switch first power to the output port as a high-power signal based on a first low-power input signal received at the first input port;
         a second switching device;

a bootstrap recharging line configured to receive first power from the second switching device and receive bootstrap power from a bootstrap power bus; and a bootstrap capacitor coupled between the bootstrap power bus and the output port;

wherein the second switching device is configured to receive boosted power from the first power bus, boosted by a voltage source, and switch boosted power to the bootstrap recharging line based on a second low-power input signal received at a second input port.

2. The circuit of claim 1, wherein the second switching device is an optoisolator.

3. The circuit of claim 1, the phase circuit further comprising:
a low side circuit comprising:
a third input port;
a third switching device configured to switch high power from the output port to ground based on a third low-power input signal received at the third input port.

4. The circuit of claim 3, wherein the first lower-power input signal is not active when the third low-power input signal is active, and the third low-power input signal is not active when the first low-power input signal is active.

5. The circuit of claim 3, wherein the second low-power input signal is based on the third low-power input signal.

6. The circuit of claim 1, wherein the second low-power input signal is based on the first low-power input signal.

7. The circuit of claim 1, wherein the second low-power input signal is based on a voltage on the output port.

8. The circuit of claim 1, wherein the second low-power input signal is based on a voltage on the bootstrap capacitor.

9. The circuit of claim 1, wherein the circuit is a switching power converter comprising:
the phase circuit, and
at least another phase circuit configured to switch first power to another output port based on another low-power input signal received at another input port, and receive second power from a second power bus and switch second power to another bootstrap capacitor.

10. A method of operating a switching power converter, the method comprising:
providing first power received from a first power bus to a first switching device configured to switch first power to a first output port as a high-power signal based on a first low-power input signal received at a first input port;
providing bootstrap power received from a bootstrap power bus to a first bootstrap recharging line;
boosting, by a first voltage source, first power from the first power bus to become first boosted power;
providing first boosted power to a second switching device configured to switch first boosted power to the first bootstrap recharging line based on a second low-power input signal received at a second input port;
providing, by the first switching device and in response to the first low-power input signal, an output voltage to the first output port;
providing the second low-power input signal to the second input port;

switching the second switching device based on the second low-power input signal; and
charging the first bootstrap capacitor with first boosted power and bootstrap power received from the first bootstrap recharging line.

11. The method of claim 10, wherein the second switching device is an optoisolator.

12. The method of claim 10, further comprising providing first power received from the first output port to a third switching device configured to switch high power at the first output port to ground based on a third low-power input signal received at a third input port.

13. The method of claim 12, wherein the first low-power input signal is not active when the third low-power input signal is active, and the third low-power input signal is not active when the first low-power input signal is active.

14. The method of claim 13, wherein the second low-power input signal is based on the third low-power input signal.

15. The method of claim 10, wherein the second low-power input signal is based on the first low-power input signal.

16. The method of claim 10, wherein the second low-power input signal is based on a voltage on the first output port.

17. The method of claim 10, wherein the second low-power input signal is based on a voltage on the first bootstrap capacitor.

18. The method of claim 10, further comprising:
providing first power received from the first power bus to a third switching device configured to switch first power to a second output port based on a third low-power input signal received at a third input port;
providing bootstrap power received from the bootstrap power bus to a second bootstrap recharging line;
boosting, by a second voltage source, first power from the first power bus to become second boosted power;
providing second boosted power to a fourth switching device configured to switch second boosted power to the second bootstrap recharging line based on a fourth low-power input signal received at a fourth input port;
providing, by the third switching device and in response to the third low-power input signal, a second output voltage to the second output port;
providing the fourth low-power input signal to the fourth input port;
switching the fourth switching device based on the second output voltage; and
charging the second bootstrap capacitor with second boosted power and second bootstrap power received from the second bootstrap recharging line.

19. The method of claim 10, further comprising:
providing the first output voltage to an electric actuator;
stalling the electric actuator to create a stall condition;
and charging the first bootstrap capacitor from the bootstrap recharging line during the stall condition.

20. The method of claim 10, wherein the first low-power input signal is a direct current (DC) signal.

21. The method of claim 10, wherein the first low-power input signal is a pulse width modulated (PWM) signal.

22. The method of claim 21, wherein the first low-power input signal is a 100% duty cycle PWM signal.

* * * * *

UNITED STATES PATENT AND TRADEMARK OFFICE
CERTIFICATE OF CORRECTION

PATENT NO. : 10,277,217 B2
APPLICATION NO. : 14/968458
DATED : April 30, 2019
INVENTOR(S) : Konstantin Lakirovich and Steven Adams It is certified that error appears in the above-identified patent and that said Letters Patent is hereby corrected as shown below:

In the Specification

Column 9, Line 29, delete "350," and insert -- 350. --, therefor.

Column 9, Line 30, delete "boosted" and insert -- Boosted --, therefor.

Column 9, Line 59, delete "In" and insert -- in --, therefor.

Column 10, Line 31 (approx.), delete "as a the" and insert -- as a --, therefor.

In the Claims

Column 13, Line 24 (approx.), Claim 4, delete "lower-power" and insert -- low-power --, therefor.

Signed and Sealed this
Third Day of March, 2020

Andrei Iancu
*Director of the United States Patent and Trademark Office*